United States Patent
Gambino et al.

(10) Patent No.: US 6,174,756 B1
(45) Date of Patent: Jan. 16, 2001

(54) SPACERS TO BLOCK DEEP JUNCTION IMPLANTS AND SILICIDE FORMATION IN INTEGRATED CIRCUITS

(75) Inventors: Jeffrey P. Gambino, Gaylordsville, CT (US); Johann Alsmeier, Wappingers Falls; Gary Bronner, Stormville, both of NY (US)

(73) Assignee: Siemens Aktiengesellschaft, Munich (DE)

( * ) Notice: Under 35 U.S.C. 154(b), the term of this patent shall be extended for 0 days.

(21) Appl. No.: 08/940,236

(22) Filed: Sep. 30, 1997

(51) Int. Cl.[7] .............. H01L 21/00; H01L 21/84
(52) U.S. Cl. ............. 438/163; 438/184; 438/514
(58) Field of Search ............... 438/163, 514, 438/527, 552, 547–548, 161, 180–181, 184

(56) References Cited

U.S. PATENT DOCUMENTS 5,262,655 * 11/1993 Ashida .
5,773,331 * 6/1998 Solomon et al. .................. 438/164

* cited by examiner

Primary Examiner—Jey Tsai
(74) Attorney, Agent, or Firm—Stanton Braden

(57) ABSTRACT

An efficient method of forming deep junction implants in one region without affecting the implant of a second region of an integrated circuit is provided. This is achieved by forming spacers of deep junction devices with the same material used to fill the gaps of shallow junction devices.

1 Claim, 2 Drawing Sheets

SPACERS TO BLOCK DEEP JUNCTION IMPLANTS AND SILICIDE FORMATION IN INTEGRATED CIRCUITS

FIELD OF INVENTION

The invention generally relates to integrated circuits, and, more particularly, to the efficient formation of integrated circuits through the use of spacers to block deep junction implants and silicide formation in a region thereof.

BACKGROUND OF INVENTION

In the fabrication of integrated circuits (ICs) or chips, there are often conflicting requirements in different regions of the IC. Such conflicts increase the complexity of the fabrication process, resulting in the need for additional process steps.

This problem can be illustrated by the differing requirements in different regions of a memory IC such as a dynamic random access memory (DRAM) or merged DRAM-logic (embedded DRAM) chip. For example, deep junctions with self-aligned silicides (salicides) are desired in the support or logic regions to minimize series resistance. However, shallow junctions with low dose implants and no silicides are desired in the array in order to minimize junction leakage.

Conventional techniques of resolving such conflict in the array and support or logic regions require additional masking steps to block deep junction implants and silicide formation in the array. Such techniques add complexity and cost to the manufacturing process, as well as increase raw process time (RPT).

As apparent from the above discussion, it is desirable to provide a more efficient and simplified technique of addressing the conflicting needs of the different chip regions.

SUMMARY OF INVENTION

The invention relates to formation of devices with deep junctions without affecting devices with shallow junctions efficiently. In one embodiment, a substrate including as least first and second regions separated by an isolation region is provided. The first region comprising first device features that are separated by wide gaps and the second region comprising second device features separated by narrow gaps. The sides of the device features comprise spacers formed from a dielectric material. An interlevel dielectric layer is formed over the substrate to sufficiently fill the narrow gaps between the second device features in the second region. An etch is then performed to remove the interlevel dielectric layer from the top of the device features and surface of the substrate, while leaving second spacers over the first spacers on the sides of the first device features. Forming the second spacers with the layer used to fill the narrow spaces between the second devices enables an implant to form deep junctions in the first devices without additional mask steps since the second devices are protected by the interlevel dielectric layer. Since only the junction regions of the first devices are exposed, silicides can also be formed without additional mask steps.

DETAILED DESCRIPTION OF THE INVENTION

Figure 1A:
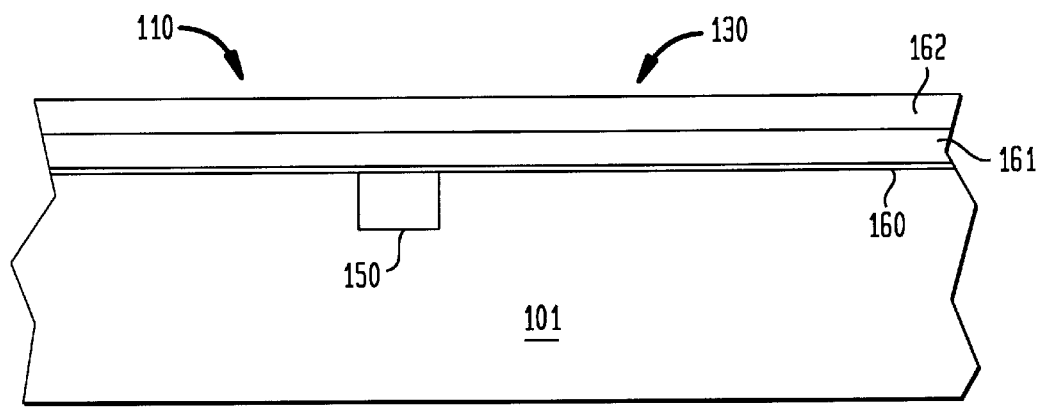
FIGS. 1a–1e show a process for fabricating a portion of an IC in accordance with one embodiment of the invention.

The present invention relates to efficient formation of an IC. The IC includes, for example, a random access memory (RAM) such as a dynamic random access memory (DRAM) or a synchronous DRAM (SDRAM). The IC may also be an application specific IC (ASIC), a merged DRAM-logic circuit (embedded DRAM), or any other logic circuit.

Typically, numerous ICs are formed on the wafer in parallel. After processing is finish, the wafer is diced to separate the ICs into individual chips. The chips are then packaged, resulting in a final product that is used in, for example, consumer products such as computer systems, cellular phones, personal digital assistants (PDAs), and other electronic products.

Referring to FIG. 1, a portion of a substrate 101 is provided. The substrate, for example, is a silicon wafer. Other substrates, such as silicon on insulator (SOI) or other semiconductor materials, are also useful. The major surface of the substrate is not critical and any suitable orientation such as a (100), (110), or (111) is useful. The substrate, for example, may be lightly or heavily doped with dopants of a pre-determined conductivity to achieve the desired electrical characteristics.

As shown, the substrate includes at least portions of first and second regions 110 and 130. The regions are separated by an isolation region 150. The isolation region, for example, is a shallow trench isolation (STI) comprising a dielectric material such as oxide. Other isolation regions, such as LOCOS, are also useful.

The second region, as shown, is the array region of a DRAM IC. In one embodiment, the array region includes a plurality of trench capacitor cells (not shown) formed in the substrate. Isolation regions (also not shown), such as STIs, are provided to separate, for example, the trench capacitors. A description of trench capacitor cells are described in, for example, Bronner et al., Proc. VLSI Symp. 1995, p.15, which is herein incorporated by reference for all purposes. Alternatively, stack capacitors are employed in the array region. Stack capacitors are formed above the array devices. The first region is the support and/or logic region.

The regions are provided with the appropriate typed dopant wells, such as n-wells and p-wells, for devices which are subsequently formed. Additionally, gate threshold voltage ($V_T$) adjust implants are performed to achieve the desire $V_T$ for the devices. Formation of the wells and VT implants are achieved by appropriate techniques such as ion implantation using resist as a mask layer. Self-aligned implants, when appropriate, are also useful.

The various layers forming the gate stacks of the devices are formed over the surface of the substrate. This includes forming an oxide layer 160 by, for example, thermal oxidation. The oxide layer serves as the gate oxide. A gate layer 161 comprising polysilicon (poly) is then deposited over the gate oxide. Alternatively, the gate layer is a composite layer such as polycide, which includes a metal silicide layer over a poly layer. The metal silicide layer may be formed from various metal silicides, including molybdenum ($MoSi_x$), tantalum ($TaSi_x$), tungsten ($WSi_x$), titanium ($TiSi_x$), or cobalt ($CoSi_x$). Formation of the poly or polycide layer is achieved using a conventional technique such as chemical vapor deposition (CVD). Other deposition techniques are also useful. A cap layer 162 is formed over the gate layer. The cap layer comprises, for example, silicon nitride ($Si_3N_4$). The nitride layer serves as an etch or polish stop for subsequent processes.

Figure 1B:
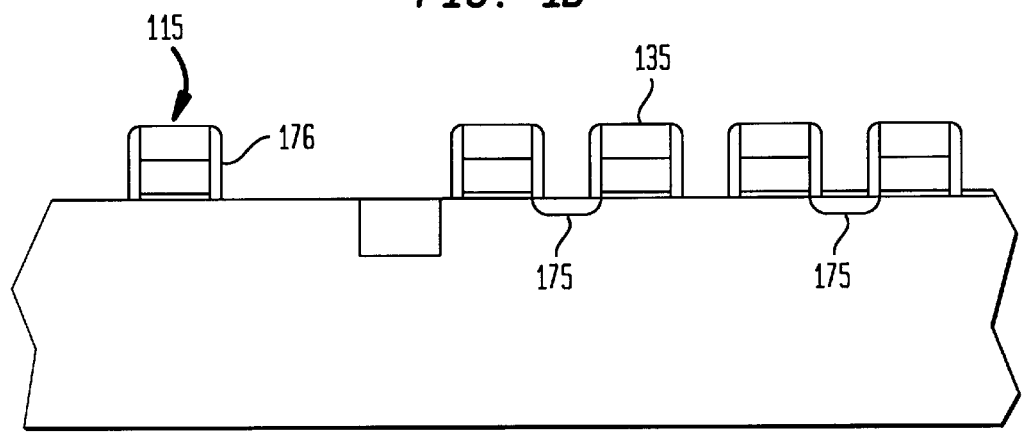

Referring to FIG. 1b, the gate stack layers are patterned using conventional lithographic and etching techniques. Such techniques include depositing a layer of resist and selectively exposing it with an exposure source and mask.

The exposed or unexposed regions, depending on whether a positive or negative resist is used, are removed during development. The regions of the gate stack layers unprotected by the resist are then etched by, for example, reactive ion etch (RIE), creating gate stack 115 in the first region and gate stacks 135 in the second region.

As shown, the device features or gate stacks 135 in the second region 130 are closely packed together, with narrow spaces (gaps) separating the features. Typically, the features and the narrow spaces (gaps) that separate the features are equal to about the minimum feature size (F) or groundrule (GR). Conversely, the feature or gate 115 in the first region includes wide gaps.

Spacers 176 are formed on the sidewalls of the devices to isolate the array contacts from the gates. The spacers comprise, for example, $Si_3N_4$. In one embodiment, the spacers are formed by conformal deposition of $SiN_4$ by chemical vapor deposition (CVD), followed by anisotropic etching. Of course, an actual DRAM or embedded DRAM IC includes additional regions with other devices. However, to simplify discussion of the invention, the IC is described with first and second regions with lesser amount of devices.

A blanket ion implant is performed to form the junction regions 175 of the array devices. Isolation regions between, for example, device pairs and the nitride layer of the gate serve as an implant mask, enabling a self-aligned implant. As previously described, this implant forms shallow junctions with low dose to reduce junction leakage. Depending on the application, support devices can be designed with source/drain regions having the same or different conductivity as the array devices. A resist layer may optionally be used and patterned to serve as an implant mask to prevent implantation of dopants in the support or logic regions. In an alternative embodiment, the array junctions are formed later on in the process.

Figure 1C:
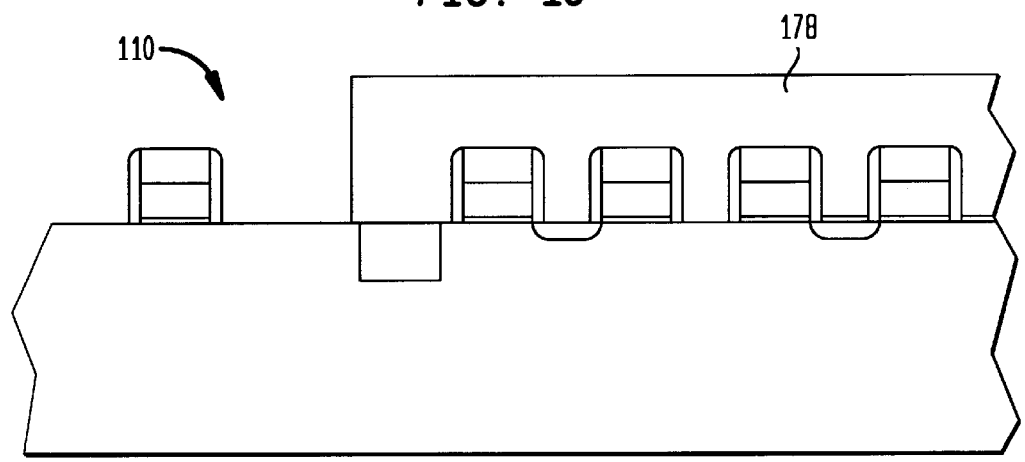

Referring to FIG. 1c, a resist layer 178 is formed over the substrate, covering it and the devices. The resist layer, which serves as an implant mask, is then patterned to expose the support region 110. An extension implant is then formed for device 115. In one embodiment, As dopant atoms are implanted. Typically, the dose and energy of the extension implant is about $10^{14}$–$10^{15}$ atoms/cm$^2$ and 10–50 KeV, respectively. The spacer controls the amount of diffusion under the gate. Upon completion of the implant, the resist layer is removed.

Figure 1D:
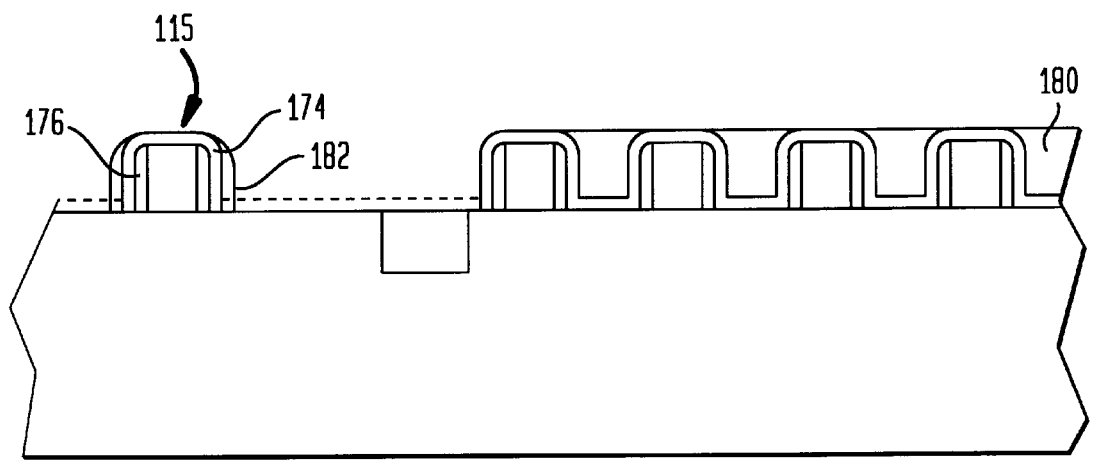

In FIG. 1d, a liner layer 174 serving as an etch stop layer for borderless contact formation is deposited over the surface of the substrate. The liner layer comprises a material which has a low etch rate during the borderless contact etch. The liner layer comprises, for example, CVD $Si_3N_4$. An interlevel dielectric layer 180 is then deposited on the substrate. In one embodiment, the interlevel dielectric layer comprises borophosphosilicate glass (BPSG). Other interlevel dielectrics such as undoped silicate glass or doped silicate glass, including phosphosilicate glass (PSG) and borosilicate glass (BSG), are also useful.

The thickness of the layer is sufficient to fill the gaps between the array devices. Since array devices are separated by a space equal to about the groundrule (GR), the thickness of the interlevel dielectric is greater than or equal to about ½×GR. The dielectric layer is etched by, for example, RIE. The etch is either selective to the liner layer or silicon. If it is selective to the liner layer, the liner layer remains over the surface of the substrate, as shown by the dotted lines. The liner layer serves as a screen for the subsequent ion implantation process. If the etch is selective to silicon, the liner layer is removed to expose the substrate surface. The RIE creates BPSG sidewall spacers 182 on device 115 and leaves the spaces between the devices 135 filled with BPSG. The sidewall spacers are formed over the spacers 176 and liner layer 174. As previously discussed, the spacers control the amount of diffusion under the gates.

In one embodiment, by filling the gaps in the array with BPSG, the array regions are protected from high dose implants and silicide processing associated with the support devices, which can degrade the retention time of the array.

The thickness of the spacers 182 is determined by the thickness of the interlevel dielectric layer 180. The thickness of the thickness should be optimized to completely fill the gaps between the array devices while providing good device characteristics for the support devices. As mentioned, the minimum thickness is about ½ GR. The thickness of the dielectric layer can be increased to provide spacers 182 with a thickness to achieve the desired device characteristics For advanced IC designs, the thickness can typically range from about 50–100 nm. Of course, this thickness can vary according to design parameters.

Figure 1E:
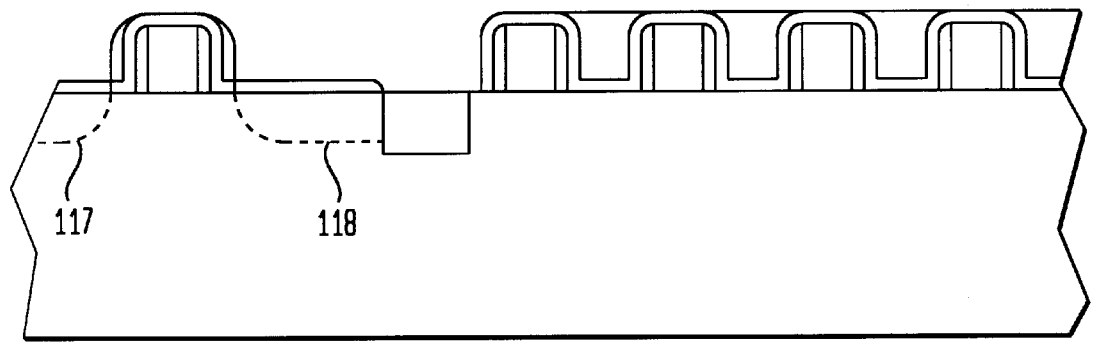

Referring to FIG. 1e, dopants are implanted to complete the formation of the source and drain diffusion regions 117 and 118 of the support device. The implant is self-aligned because the interlevel dielectric and array devices serve as an implant mask. The dose and energy of the implant is sufficient to provide deep source and drain regions. In one embodiment, As dopants are implanted. Typically, the dose and energy of the deep implant are about $5\times10^{14}$–$5\times10^{15}$ atoms/cm$^2$ and about 20–100 KeV. Of course, the dose and energy of the implant vary depending on, for example, combined thickness of the BPSG and $Si_3N_4$ spacers and the liner layer if present.

An optional silicide layer can be formed over the diffusion regions 117 and 118. If the nitride liner above the diffusion region was not removed during formation of the spacers, it is removed using either a wet or dry etch. The silicide layer, in one embodiment, comprises titanium silicide ($TiSi_x$). Other suicides, including molybdenum ($MoSi_x$), tantalum ($TaSi_x$), tungsten ($WSi_x$), or cobalt silicide ($CoSi_x$), are also useful. The silicide layer is formed by conventional salicide process. Such salicide process includes, for example, HF dip, metal deposition, anneal, and wet etch to pattern the silicide layer. A description of salicide formation is provided in, for example, Colgan et al., *Materials Science and Engineering*, Vol. R16 1996 p.43, which is herein incorporated by reference for all purposes.

In FIG. 1f, an oxide layer 190 is optionally formed on the substrate. Formation of the oxide layer can be achieved by various known techniques, such as thermal oxidation or CVD. The oxide layer is sufficiently thick to serve as a dopant barrier if a doped silicate glass is used as an interlevel dielectric layer 193. Typically, the oxide layer is about 20 nm thick. The interlevel dielectric layer is then deposited on the substrate. The interlevel dielectric includes, for example, BPSG or PSG. The thickness of the interlevel dielectric is typically about 500–1000 nm. Since gap fill is no longer an issue, undoped silicate glass is also useful. The use of undoped silicate glass enables the elimination of the oxide barrier layer.

Referring to FIG. 1g, the process continues to form the IC. This includes planarizing the interlevel dielectric layer to create a planar surface. A cap layer is formed over the planarized interlevel dielectric layer 193. Contact openings 198 which expose, for example, the diffusion regions and conductive lines are formed. In some cases, diffusion regions have not yet been formed. To form the diffusion regions, dopants are implanted through the contact openings. The openings and lines are then filled with conductive material to provide electrical connections as desired. The conductive material, for example, comprises metallic material such as aluminum Ti, TiN, W, or Cu. In some cases, barrier or liner layers may be needed. After the conductive material is deposited, the surface is planarized, using the cap layer as a polish stop to create a planar surface. Additional interlevel dielectric and metal layers may be formed to complete processing of the IC.

While the invention has been particularly shown and described with reference to various embodiments, it will be recognized by those skilled in the art that modifications and changes may be made to the present invention without departing from the scope thereof. The scope of the invention should therefore be determined not with reference to the above description but with reference to the appended claims along with their full scope of equivalents.

What is claimed is:

1. A method for forming an integrated circuit (IC) comprising:

providing a substrate including as least first and second regions separated by an isolation region, the first region comprising first device features that are separated by wide gaps, the second region comprising second device features separated by narrow gaps, wherein the sides of the first and second devices include a first spacer formed from a dielectric material;

depositing an interlevel dielectric layer to sufficiently fill the narrow gaps between the second device features in the second region;

etching the interlevel dielectric layer, whereby the etching forms second spacers on the side of the first features over the first spacers and removes the interlevel dielectric layer on the top of wide spaces while leaving the narrow spaces in the first region filled with the interlevel dielectric layer, implanting dopants to form deep junctions for the first devices, wherein the interlevel dielectric layer used to form the second spacers of the first devices protects the second region from being affected by the implant.

* * * * *

UNITED STATES PATENT AND TRADEMARK OFFICE
CERTIFICATE OF CORRECTION

PATENT NO. : 6,174,756 B1
DATED : January 16, 2001
INVENTOR(S) : Gambino et al.

It is certified that error appears in the above-identified patent and that said Letters Patent is hereby corrected as shown below:

<u>Title page,</u>
Item [73], Assignee, information should read -- Siemens Aktiengesellschaft, Munich (DE), and International Business Machines Corporation, Armonk, NY --

Signed and Sealed this

Nineteenth Day of August, 2003

JAMES E. ROGAN
*Director of the United States Patent and Trademark Office*